(12) United States Patent
Hohnerlein et al.

(10) Patent No.: US 11,496,099 B2
(45) Date of Patent: Nov. 8, 2022

(54) SYSTEMS AND METHODS FOR LIMITER FUNCTIONS

(71) Applicant: Mimi Hearing Technologies GmbH, Berlin (DE)

(72) Inventors: Christoph Hohnerlein, Berlin (DE); Nicholas R. Clark, Royston (GB)

(73) Assignee: Mimi Hearing Technologies GmbH, Berlin (DE)

( * ) Notice: Subject to any disclaimer, the term of this patent is extended or adjusted under 35 U.S.C. 154(b) by 288 days.

(21) Appl. No.: 16/940,860

(22) Filed: Jul. 28, 2020

(65) Prior Publication Data
US 2022/0038062 A1 Feb. 3, 2022

(51) Int. Cl.
| | |
|---|---|
| *H03G 11/00* | (2006.01) |
| *H03G 7/00* | (2006.01) |
| *H03G 3/20* | (2006.01) |
| *H03G 5/00* | (2006.01) |
| *H03F 1/32* | (2006.01) |
| *H03G 9/00* | (2006.01) |
| *G10H 3/18* | (2006.01) |

(52) U.S. Cl.
CPC .......... *H03F 1/3264* (2013.01); *G10H 3/187* (2013.01); *H03G 7/001* (2013.01); *H03G 9/005* (2013.01)

(58) Field of Classification Search
CPC .. H03G 5/00; H03G 3/20; H03G 7/00; H03G 11/00
USPC ................................ 381/104, 106, 107, 94.8
See application file for complete search history.

(56) References Cited

U.S. PATENT DOCUMENTS

2015/0215700 A1\* 7/2015 Sun ........................ H04R 3/002
381/94.2

\* cited by examiner

*Primary Examiner* — George C Monikang
(74) *Attorney, Agent, or Firm* — Polsinelli PC (57) ABSTRACT

Disclosed are systems and methods for processing an audio signal. In particular, there is provided a method for determining dynamic gain values to be applied on a digital input signal. The digital signal may be arranged in blocks. The dynamic gain values may be used for attenuating input signal values exceeding a clipping threshold. More particularly, the method comprising, for each signal block, passing backwards over the next signal block and the current signal block to produce a preliminary gain contour from the input signal; and passing forwards over the current signal block to produce a final gain contour for the current signal block based on the preliminary gain contour, wherein the gain contours are produced by applying an instant gain ascent and a smooth gain decay to the gain contours.

18 Claims, 8 Drawing Sheets

SYSTEMS AND METHODS FOR LIMITER FUNCTIONS

TECHNICAL FIELD

The present disclosure pertains to digital signal processing (DSP) and audio engineering, and more specifically pertains to systems and methods for processing an audio signal to mitigate hard clipping, for example by providing a look-ahead limiting function.

BACKGROUND

The present disclosure pertains to digital signal processing (DSP) and audio engineering, and more specifically pertains to systems and methods for processing an audio signal to mitigate hard clipping, for example by providing a limiter function that looks ahead based on oversampling of an audio signal.

Due to different aspects of audio recording and reproduction, a waveform may have a sound intensity greater than an audio output device can deliver—leading to potential damage of the audio circuitry and transducer. To prevent this, the signal may be clipped at the maximum capacity of the speaker, leading to a square-wave-type waveform, resulting in a harsh and unpleasant sound due to the harmonics generated as a result of this square wave. The harmonics additionally may lead to further damage to the transducer over a period of time. Another possible issue that could introduce clipping may be in a digital system that uses fixed point representation of numbers (for example, a classic 16-bit way file), in which there are typically strict upper and lower bounds of which numbers can be stored. Correspondingly, any number that is higher or lower will be clipped to those limits.

This may, in one example, be resolved by introducing a (e.g., large) delay into the audio signal, thus looking ahead at the signal to dynamically adjust attenuation through dynamic range compression. However, the (large) latency introduced in this technique may cause problems, in particular if a digital signal processing algorithm may be subject to additional downstream processing—e.g. a latency may degrade a signal and lessen signal interactivity. In another example, a soft clipping strategy may be used to avoid hard clipping, which produces less distortion than hard clipping, and thus generally a more pleasant sound. In particular, by applying a suitable wave shaping function (e.g., an arctangent function), the signal can be correctly constrained and the transition between non-clipped and clipped is smoothed out. This lowers the amount of unpleasant distortion at no additional delay, but this will also modify non-clipped signal portions.

SUMMARY

The present disclosure features systems and methods for soft limiting functions using the already introduced delay from e.g. a block-wise oversampling scheme, thus obviating the need to introduce additional latency in the audio signal.

Unless otherwise defined, all technical terms used herein have the same meaning as commonly understood by one of ordinary skill in the art to which this technology belongs.

The term 'audio device', as used herein, is defined as any device that outputs audio, including, but not limited to: mobile phones, computers, televisions, hearing aids, hearables, headphones, embedded audio systems and/or sound reproduction systems. For example, embedded audio systems and/or sound reproduction systems can include, but are not limited to, various different arrangements and configurations of multi-channel speaker systems, such as the five or seven channel surround sound systems commonly available to both consumers and professionals.

The phrase 'clipping', as used herein, is defined as the phenomenon wherein a waveform is clipped at the maximum intensity of a transducer or the digital numerical representation, leading to a loss in signal information and sharp discontinuities, which results in harsh and unpleasant sounding harmonics.

The phrase 'limiter function', as used herein, is defined as a function that dynamically brings down (or attenuates) high amplitude signals;

The phrase 'dynamic range compression' or DRC', as used herein, is defined as an audio process that reduces the dynamic range of an audio signal. Dynamic range compression may occur instantaneously, or the rate may be controlled through adjustment of a compressor's attack and release time constants. Also, the gain attenuation may have separate attack and release times, which may range hold any positive value including zero (0).

The phrase 'computer readable storage medium', as used herein, is defined as a solid, non-transitory storage medium including, but not limited to: flash memory or various forms of disk storage. It may also be a physical storage place in a server accessible by a user, e.g. to download for installation of the computer program on a user device or for cloud computing.

According to one broad aspect, there is provided a method for determining dynamic gain values to be applied on a digital input signal such as an audio signal. The determined gain may be applied to the signal in order to limit the maximum signal amplitudes for avoiding signal clipping. In particular, the dynamic gain values may be used for attenuating input signal values exceeding a clipping threshold. The clipping threshold may be a preset (or preconfigured) threshold value, or may be determined on the go (e.g., by any suitable signal processing means), as will be appreciated by the skilled person. The audio signal may be a separate audio signal such as from a music file, or a composite digital media signal comprising audio and other media, such as a video signal. In particular, the digital signal may be arranged in a sequence of consecutive (signal) blocks, e.g., by using any suitable signal processing means, as will be understood and appreciated by the skilled person. Arranging the input signal in signal blocks is typical for processing techniques where signal oversampling and overlap-add steps are applied. More particularly, the method may be performed and repeated on each signal block of the sequence of signal blocks, and may comprise, for each signal block, passing backwards over the next signal block and the current signal block to produce a preliminary gain contour from the input signal. The method may further comprise passing forwards over the current signal block to produce a final gain contour for the current signal block based on the preliminary gain contour. The gain contours (i.e., the preliminary gain contour and the final gain contour) may be smooth contours that are generated by any suitable signal processing means. In particular, the gain contours may be produced by applying an instant gain ascent and/or a smooth gain decay to the gain contours. For example, the preliminary gain contour is produced in the backwards pass by applying in reverse an instant gain ascent and a smooth gain decay to the input signal. The backwards pass thus starts at the end of the next signal block (i.e. with the last signal sample of the next signal block) and moves backwards towards the beginning of the current signal block (i.e. its first signal sample). The final gain contour may be produced in the forwards pass by applying an instant gain ascent and a smooth gain decay to the preliminary gain contour, by starting from the beginning of the current signal block (i.e. its first signal sample) and working towards its end (i.e. its last signal sample). An instant gain ascent means that the gain contour jumps up immediately if the next (going backwards or forwards) value is larger. A smooth gain decay means that the gain contour declines at a certain rate if the next (going backwards or forwards) value is smaller. Notably, although the term "gain" is used in most parts of this description, the skilled person understands that a gain applied to a signal to prevent clipping is typically a gain with a value smaller than one (<1), i.e. an attenuation that reduces the signal amplitude. Thus, the terms "gain" and "attenuation" shall denote the same signal amplitude reduction.

It is to be noted that the proposed approach allows determining a continuous gain contour for a signal block based on the current signal block and the next signal block. To be specific, the preliminary gain contour is determined, during passing backwards, for both the next signal block and the current signal block; while the final gain contour is determined, during passing forwards, for the current signal block. The current signal block may be processed (e.g. by applying the gain contour to the input signal to avoid signal clipping) without the need for information that would introduce additional delay. This could generally allow for real time processing of signal blocks without adding further delays/latency which is particular useful in signal processing arrangements where the signal is processed in blocks anyway. For example, no additional delay is introduced when using traditional oversampling schemes like overlap-add, often used for frequency domain processing.

The gain values may be determined based on the difference between signal peak and the clipping threshold (in dB), e.g. such that the modified signal at the signal peak has a given relationship to the clipping threshold. In examples, the modified signal value at the signal peak reaches the clipping threshold or has a value that is a certain ratio of the clipping threshold (e.g. 0.9 times the clipping threshold). The gain values of the gain contour in the attack and release sections may be determined from the signal peak gain by applying a continuous gain modification according to the contour curve. Generally speaking, in the linear domain, the contour that represents the gain or attenuation factor should follow exponential curves, as this roughly represents a smooth loudness transition to the human ear. In dB-domain, these exponential curves would then look like straight lines and are usually easier to visualize and to reason about, as can be clearly understood and appreciated by the skilled person. For example, a linear gain modification in the dB-domain with the distance to the signal peak may be applied until the gain reaches a value (e.g. 0 dB) that does not modify (attenuate) the signal anymore.

In some examples, the method may further comprise discarding the preliminary gain contour and repeating the backwards pass and the forward pass for the next signal block. In other words, before moving to the processing of the next signal block, the previously determined preliminary gain contour may be discarded (or reset).

In some example, the backwards pass may generate, in the preliminary gain contour, gain attack curves for signal peaks in the current and the next signal block.

In some example, the forwards pass may generate, in the final gain contour, gain release curves for the signal peaks in the current signal block.

Generally speaking, the term 'attack' is typically used to refer to the period when the gain applied to the signal (e.g., by a compressor) is continuously decreased (or the attenuation increased) to reach (in the direction of the input signal sampling order) the predetermined maximum signal value (e.g., the clipping threshold in the present case) at a signal peak. During the attack period, the gain value is continuously decreased from a value of 1 (i.e. 0 dB, no signal modification) to a minimum gain value for bringing the signal amplitude at the signal peak down to the predetermined maximum signal value. In other words, the attack period is the time before the signal peak where the input signal is modified (attenuated) by applying a decreasing gain value thereto.

Similarly, the term 'release' is typically used to refer to the period when the gain is continuously increased (e.g., by the compressor) (or the attenuation decreased) from the predetermined maximum signal value (e.g., the clipping threshold in the present case) at the signal peak. During the release period, the gain value is continuously increased from the minimum gain value at the signal peak to a value of 1. In other words, the release period is the time after the signal peak where the input signal is modified by multiplication with an increasing gain value.

In some examples, the gain release curves and the gain attack curves may be smooth curves having their respective maximum at signal peaks. Typically, a gain release curve and a gain attack curve associated with a signal peak meet from both sides at the signal peak to form a continuous curve. By applying a continuous curve of gain values to the input signal, abrupt signal distortions (e.g. signal jumps) are avoided.

In some examples, the gain release curves and the gain attack curves may be linear ramps having constant slope in the dB domain, which would correspond to exponential changes in amplitude. However, as will be understood and appreciated by the skilled person, any other suitable curves (or functions) may be used for determining the gain release curves and the gain attack curves. In most cases, the curves are smooth curves that transition continuously from (or to) a value that does not modify the input signal (e.g. gain=1 or 0 dB) to (or from) a maximum value where the input signal at the signal peak is limited to the clipping threshold.

In some examples, if the next input signal sample in the backwards pass exceeds the clipping threshold and is larger than the current input signal sample, the preliminary gain value for the next sample may be set so as to attenuate the next sample in accordance with the clipping threshold. On the other hand, if the next input signal sample in the backwards pass exceeds the clipping threshold and is smaller than the current one, the preliminary gain value for the next sample may be set so as to smoothly decay from the gain value of the current input signal sample.

In some examples, in the forwards pass, if the next preliminary gain value is larger than the current one, the next final gain value may be set to the next preliminary gain value. Otherwise, the next final gain value may be set so as to smoothly decay from the current final gain value.

In some examples, the forwards pass of the next signal block may start with the last final gain value of the current signal block so that the final gain contour for the current signal block may be a continuous function of gain values for the signal samples of the current block, having a continuous transition to the gain contour of the next signal block.

In some examples, the preliminary gain contour and the final gain contour may be produced by applying a one-pole filter with infinite ascent. However, it should be noted that any other suitable means may be adopted for generating/producing the preliminary gain contour and the final gain contour, as will be appreciated by the skilled person.

In some examples, the rate of gain change (e.g. gain slope) is dynamically adapted based on a signal peak in the current hop and/or the next hop.

In some examples, the slowest gain change rate to reach a signal peak in a hop may be selected.

In some examples, the gain change rate may be dynamically adapted based on an average of peaks in the input signal over a period of time.

In some examples, the final gain contour for the current signal block may be applied as attenuation to signal samples of the current block to prevent signal clipping.

In some examples, the final gain contour may be a smooth curve having its maxima at input signal peaks. The maximum of the gain contour at an input signal peak means that the input signal receives its maximum modification (e.g. maximum attenuation) at the signal peaks, e.g., so as to make the signal not exceeding the clipping threshold.

In some examples, the final gain contour for the current signal block may be applied as attenuation to signal samples of the current block to prevent signal clipping (e.g., when being played back).

In some examples, the final gain contour for the current signal block may be a continuous function of gain values for the signal samples of the current block, having a continuous transition to the gain contour of the succeeding signal block. However, as will be understood and appreciated by the skilled person, any other suitable curves (or functions) may be used for determining the final gain contour. Preferably, the final gain contour for the current signal block and the final gain contour for the succeeding signal block may be continuous, e.g., satisfying first order (or even higher) continuity at the transition point.

In some examples, the digital signal may be an audio signal. However, the method of the present disclosure may be as well applied to any other suitable form of (digital or even non-digital) signal.

In some examples, the blocks may be arranged in frames of multiple blocks and may be processed by an overlap-add method such as applied by signal transformations into a transform domain. Examples of such signal transformations are (fast) Fourier transforms (FFT) or modified discrete cosine transforms (MDCT). The skilled person will appreciate that other processing of a digital signal based on other signal transforms may benefit from the proposed method as well.

In some examples, the overlap-add method may have a hop-size of a suitable number of samples (which is typically a percentage of the window or block size). Of course, any other suitable signal processing method or any other suitable hop size may be applied thereto.

According to another broad aspect, there is provided a signal processing method. In particular, the signal processing method may comprise frequency domain processing of an input signal, a time domain signal reconstruction of the processed input signal and the signal limiting method according to any of the previous examples.

According to another broad aspect, there is provided a signal processor for determining dynamic gain values to be applied on a digital input signal. The digital signal may be arranged in (signal) blocks. The signal processor may comprise a backwards processor for passing backwards over the next signal block and the current signal block to produce a preliminary gain contour from the input signal; and a forwards processor for passing forwards over the current signal block to produce a final gain contour for the current signal block based on the preliminary gain contour. In particular, the backwards processor and the forwards processor produce gain contours by applying an instant gain ascent and a smooth gain decay. Optionally, in some cases, the signal processor may also comprise a signal peak detector for determining signal peaks that exceed a clipping threshold in a current signal block and a succeeding signal block. For instance, the peak detection might be needed if one would want to skip the limiting process if no peaks were detected, or in order to dynamically determine the gain change rate or slope based on how much a peek exceeds the clipping threshold.

According to another broad aspect, there is provided a signal limiter for providing clipping protection. In particular, the signal limiter may comprise the signal processor according to the previous aspect. In addition, the signal limiter may further comprise a signal attenuator for applying the gain contour provided by the signal processor as attenuation to signal samples of the current block.

According to yet another broad aspect, there is provided a computer program product comprising processor readable instructions for causing a processor, when executing the instructions, to perform the method according to any of previous examples.

While some example embodiments will be described herein with particular reference to the above application, it will be appreciated that the present disclosure is not limited to such a field of use, and is applicable in broader contexts.

Notably, it is understood that methods according to the present disclosure relate to methods of operating the apparatuses according to the above example embodiments and variations thereof, and that respective statements made with regard to the apparatuses likewise apply to the corresponding methods, and vice versa, such that similar description may be omitted for the sake of conciseness. In addition, the above aspects may be combined in many ways, even if not explicitly disclosed. The skilled person will understand that these combinations of aspects and features/steps are possible unless it creates a contradiction which is explicitly excluded.

Implementations of the disclosed apparatuses may include using, but not limited to, one or more processor, one or more application specific integrated circuit (ASIC) and/or one or more field programmable gate array (FPGA). Implementations of the apparatus may also include using other conventional and/or customized hardware such as software programmable processors, such as graphics processing unit (GPU) processors.

Other and further example embodiments of the present disclosure will become apparent during the course of the following discussion and by reference to the accompanying drawings.

BRIEF DESCRIPTIONS OF THE DRAWINGS

In order to describe the manner in which the above-recited and other advantages and features of the disclosure can be obtained, a more particular description of the principles briefly described above will be rendered by reference to specific embodiments thereof, which are illustrated in the appended drawings. Understand that these drawings depict only exemplary embodiments of the disclosure and are not therefore to be considered to be limiting of its scope, the principles herein are described and explained with additional specificity and detail through the use of the accompanying drawings in which.

DETAILED DESCRIPTION

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure. Thus, the following description and drawings are illustrative and are not to be construed as limiting the scope of the embodiments described herein. Numerous specific details are described to provide a thorough understanding of the disclosure. However, in certain instances, well-known or conventional details are not described in order to avoid obscuring the description. References to one or an embodiment in the present disclosure can be references to the same embodiment or any embodiment; and, such references mean at least one of the embodiments.

Reference to 'one embodiment' or 'an embodiment' means that a particular feature, structure, or characteristic described in connection with the embodiment is included in at least one embodiment of the disclosure. The appearances of the phrase 'in one embodiment' in various places in the specification are not necessarily all referring to the same embodiment, nor are separate or alternative embodiments mutually exclusive of other embodiments. Moreover, various features are described which may be exhibited by some embodiments and not by others.

The terms used in this specification generally have their ordinary meanings in the art, within the context of the disclosure, and in the specific context where each term is used. Alternative language and synonyms may be used for any one or more of the terms discussed herein, and no special significance should be placed upon whether or not a term is elaborated or discussed herein. In some cases, synonyms for certain terms are provided. A recital of one or more synonyms does not exclude the use of other synonyms. The use of examples anywhere in this specification including examples of any terms discussed herein is illustrative only, and is not intended to further limit the scope and meaning of the disclosure or of any example term. Likewise, the disclosure is not limited to various embodiments given in this specification.

Without intent to limit the scope of the disclosure, examples of instruments, apparatus, methods and their related results according to the embodiments of the present disclosure are given below. Note that titles or subtitles may be used in the examples for convenience of a reader, which in no way should limit the scope of the disclosure. Unless otherwise defined, technical and scientific terms used herein have the meaning as commonly understood by one of ordinary skill in the art to which this disclosure pertains. In the case of conflict, the present document, including definitions will control.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

It is an aspect of the present disclosure to provide systems and methods for processing an audio signal to mitigate hard clipping, for example by providing a limiter function that looks ahead based on oversampling of an audio signal.

According to a broad aspect, the method may comprise a backward pass starting from the end of the next signal block or hop, ending at the start sample of the current hop. This produces a gain envelope or contour that has attack contour curves. Next is a forward pass over the produced gain envelope, starting from the beginning of the envelope until the end of the current hop, to produce a final gain envelope (containing attack+release contour curves) for the current hop. This allows attenuating the current hop with that envelope. The state of the backward envelope is then reset. The forward envelope can be maintained and keep its internal state. This allows to continue correctly on the next hop. If no signal value in a signal block is above the clipping threshold, the envelope is all 1 (or 0 dB), so no signal change is applied. Optionally, the above processing for the signal block may be skipped in this case. In example embodiments, one-pole filters with infinite attack are employed to produce both envelopes. These filters have one sample memory and handle a new input like such:

1. if the input is larger than the memory: set the memory=input (this provides an instantaneous attack);
2. if the input is smaller than the memory: set the memory=a mix of the memory with the input at a certain ratio (this ratio provides the exponential decay towards the input);
3. output the memory.

In some embodiments, the attack/release slopes are dynamically adjusted based on the input signal, in particular the value of the input signal peaks. Changing the gain of a signal introduces distortion that correlates with the speed of the gain change, i.e. a faster gain change results in more distortion and a slower gain change means less distortion. Therefore, it is desired to select the slowest possible attack/release rate that still allows to "catch" a certain level of peaks at a given hop size. For example: for a hop size of 64 samples, it is necessary to change the gain 3/64 dB per sample to catch a +3 dB peak at the 65th sample. The time constants for the attack/release rates may be adjusted during processing to reduce distortion, which provides an additional improvement.

For example, for each block, the slowest necessary attack rate is automatically selected to catch a given signal peak value exceeding the clipping limit. Further, the exceeding peaks over a period of time can be averaged and the attack/release rates adjusted accordingly.

Figure 1:
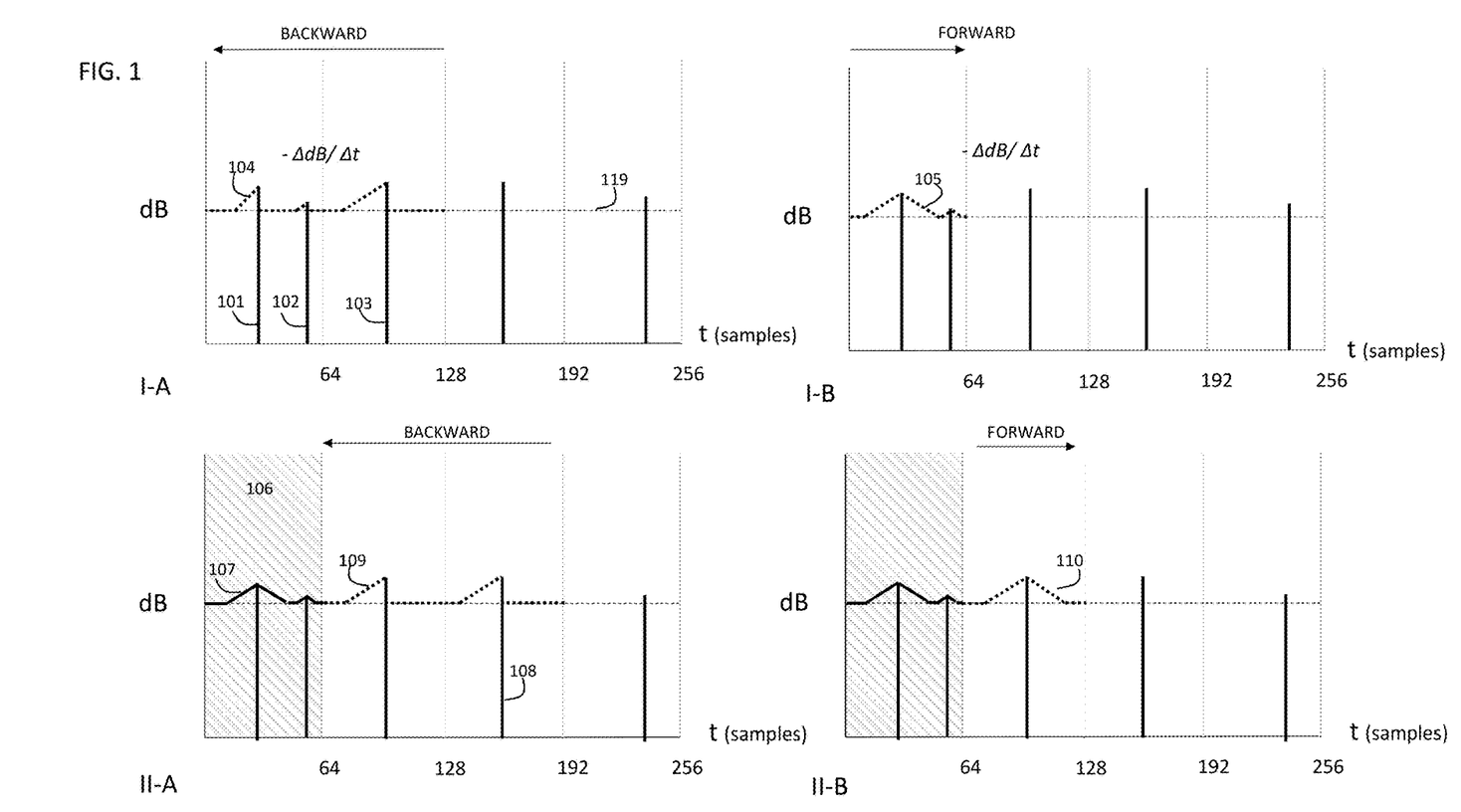
FIG. 1 illustrates an exemplary audio signal in which gain release and gain attack contour curves are successively applied to audio signal exceeded a threshold value in order to mitigate clipping.

FIG. 1 schematically illustrates, without any limitation, an exemplary audio signal comprising four signal blocks bearing five amplitude peaks 101, 102, 103, 108 and 114 that exceed a dB threshold value 119. There may be, but generally it is not necessary to have separate peak detection functionality, for carrying out the proposed method. Nevertheless, in some scenarios, to save processing power and in cases where clipping is unlikely, the method could optionally run a peak detection and then skip the (computationally expensive) limiting process for signal blocks if no signal value in the signal block is above the threshold. Further, in the present example, the block size is set to 64 (samples). However, it should be understood that any other suitable block size may be applied. The threshold value 119 may be preset, preconfigured, determined during run time, or determined using any other suitable means, as will be understood and appreciated by the skilled person.

First, in diagram I-A of FIG. 1 a preliminary gain contour 104 (indicated as a dashed line) is produced by passing backwards over the next (i.e., succeeding) signal block (samples 64-127) and the current signal block (samples 0-63). That is, the preliminary gain contour 104 may be generated or determined starting from the last sample (of the next signal block) 127 and continuing backwards till the first sample (of the current signal block) 0. In particular, the generation of the preliminary gain contour 104 may involve generating gain attack curves for signal peaks of the input signal in the current and the next signal blocks (in the direction of consecutive input signal samples). Referring to the example of diagram I-A of FIG. 1, the preliminary gain contour 104 may be generated in such a way that gain attack curves (or envelopes) for signal peaks 101, 102 and 103 are generated. Next, in diagram I-B of FIG. 1, gain contour 105 (indicated as a dashed line) is produced by passing, in a forward manner, over the current signal block (0-63). That is, the gain contour 105 may be generated or determined starting from the first sample (of the current signal block) 0 and continuing forwards till the last sample (of the current signal block) 63. In particular, the generation of the gain contour 105 may involve generating gain release curves for signal peaks in the current signal block (in the direction of consecutive input signal samples). Referring to the example of diagram I-B of FIG. 1, the gain contour 105 may be generated in such a way that gain release curves (or envelopes) for signal peaks 101 and 102 are generated. As can be understood and appreciated by the skilled person, generally speaking, the term 'attack' is typically used to refer to the period before the signal peak when the gain applied to the input signal (in its natural sampling order) is decreased (or the corresponding attenuation increased) to reach the predetermined gain for the signal peak (e.g., corresponding to the clipping threshold value 119 in the present case). Similarly, the term 'release' is typically used to refer to the period after the signal peak when the gain is increased (or the corresponding attenuation decreased) from the predetermined gain for the signal peak (e.g., corresponding to the clipping threshold value 119 in the present case) to a value where the signal is not modified anymore.

Figure 2:
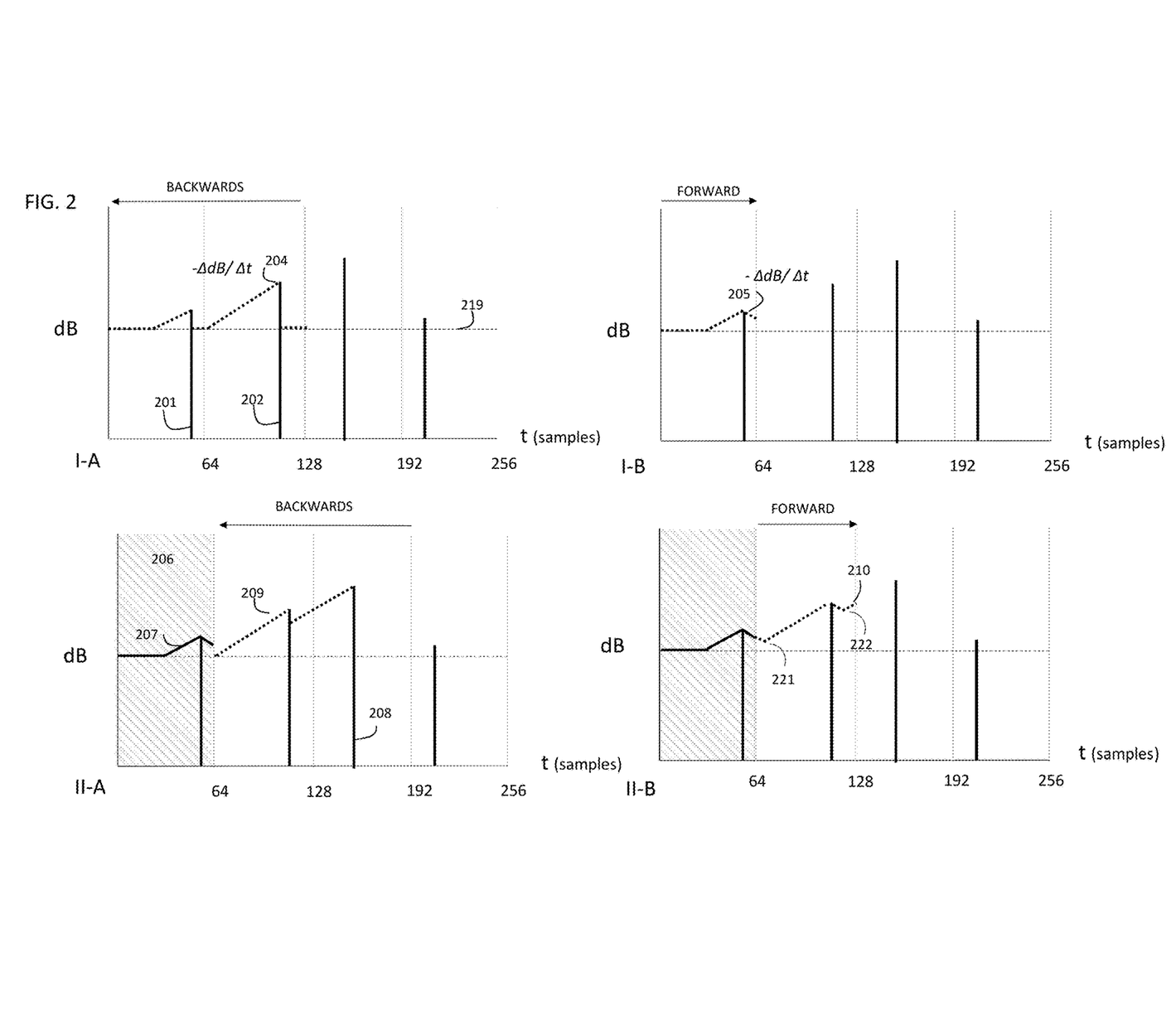
FIG. 2 illustrates another exemplary audio signal in which gain release and gain attack contour curves are successively applied to audio signal exceeded a threshold value in order to mitigate clipping.

It is to be noted that in this example the gain attack/release contours in the log (dB) domain are linear curves having a given slope ($\Delta db|\Delta t$). The slopes of the attack and release contours may be the same or different. For example, the attack contours may have a steep slope and the release contours may be shallower. In addition, the slopes may depend on the value of the signal peak. It is also to be noted that, generally speaking, the contour that represents the attenuation factor should typically follow exponential curves, as this roughly represents a smooth loudness transition to the human ear. In dB domain (as is the case in the examples as shown in FIG. 1 and FIG. 2), these exponential curves look like straight lines and are usually easier to visualize and to reason about.

Although the gain contours are shown to have their highest values at the signal peaks, the skilled person understands that this is for illustration only and the depicted curves more represent an attenuation resulting from the corresponding gain (with a given offset resulting from the clipping threshold). Actually, the gain values are lowest (and the attenuation maximum) at peak signal values. For example, a gain value may be determined based on the difference between the corresponding signal peak and the clipping threshold, e.g. such that the modified signal at the signal peak reaches the clipping threshold or has a value that is a certain ratio of the clipping threshold (e.g. 0.9 times the clipping threshold). The gain values of the gain contours in the attack and release sections before and after the peak may be determined from the signal peak gain by applying a continuous gain modification according to the contour curve. For example, in case of straight curves in the log (dB) domain, a linear gain modification with a given slope ($\Delta db|\Delta t$) may be applied until the gain reaches a value (e.g. 0 dB where the attack and release contours are fading out) that does not modify the signal anymore. Reciprocally, the attenuation is maximal at a signal peak (e.g. signal peak value in dB—clipping threshold in dB) and goes down (e.g. linearly) to 0 dB at the ends of the attack and release sections.

Thereafter, a final gain contour 107 (indicated as a solid line) is determined or generated for the current signal block 106 (i.e. samples 0-63) based on the preliminary gain contour 104 and gain contour 105, resulting in a completed signal block 106 (see diagram II-A of FIG. 1). Optionally, after the gain contour 107 for the current signal block (samples 0-63) has been determined, the previously determined preliminary gain contour 104 may be discarded (or reset) while the gain contour 105 may be retained, before moving to the next signal block (64-127).

In examples, the gain contours 104, 105, 107 are generated by passing backwards over the next signal block and the current signal block to produce the preliminary gain contour 104 from the input signal, wherein the preliminary gain contour is produced by applying (in reverse input signal direction) an instant gain ascent and a smooth gain decay to the input signal. Next, the gain contour 105 for the current signal block is produced by passing forwards over the current signal block based on the preliminary gain contour, wherein the gain contour 105 is produced by applying (in forwards direction) an instant gain ascent and a smooth gain decay to the preliminary gain contour. The gain contour 105 produced in the forwards pass from the preliminary gain contour 104 is then used as the final gain contour 107 that is subsequently applied on the current signal block of the input signal to prevent signal clipping.

The above process successively continues for signal block 112 (i.e. samples 64-127) and the succeeding signal block 116 (i.e. samples 128-191), leading to preliminary gain contour 109 and gain contour 110—and resulting in a final gain contour for signal block 112 (i.e. samples 64-127). In an analogous manner, the process then repeats in diagrams III-A, Ill-B, IV-A and IV-B of FIG. 1, for which the respective repeated description may be omitted for reasons of conciseness.

Summarizing, in a broad sense, the proposed mechanism involves, at first, a backward pass over the next/succeeding and the current signal block (or, in some cases, also referred to as hop), in order to produce an attack envelope (or contour). Subsequently, the mechanism involves a forward pass over the generated attack envelope for the current block/hop, in order to produce a release envelope. Then, the backward envelope may be reset while the state of forward envelope may be retained, before the mechanism moving to the next block/hop for processing. Specifically, the generation of the envelopes may operate like such when processing a signal: if the next sample value is larger (than the current sample value), "jump up" immediately; while on the other hand, if the value of the next sample is smaller (than the current sample value), decline towards it at a certain rate (or in some cases, also referred to as decay). Put differently, the gain contours may be produced by applying an instant gain ascent and a smooth gain decay to the gain contours. In practice, a possible implementation may be using a one-pole filter with infinite attack. Because the forward pass only processes the current hop, it will be in the correct state when doing the next forward pass on the next iteration. However, it should be understood that any other suitable means for generating the gain contours may be implemented depending on various cases, as will be appreciated by the skilled person.

Regarding the possible slopes of the gain contours (attack/release), it is to be noted that, generally speaking, changing the gain of a signal will typically introduce distortion that correlates with the speed of the gain change. That is, a faster gain change may be generally considered to result in more distortion. Therefore, in some cases, it may be an option to choose/select the slowest possible attack/release that still allows for "catching" a certain level of peaks at a given hop size. For example, for a hop size of 64 samples, it may be needed to change the gain 3/64 dB per sample in order to catch a +3 dB peak at the 65th sample. In addition, it is to be noted that, typically the output of one-pole filters (which may be used to generate gain contours) may logarithmically fall towards the target value, which is generally a smooth transition for human ears and also to avoid distortion. The actual values of the generated envelopes (contours) are therefore also exponential/logarithmic. Thus, for simplicity, the envelopes are drawn in dB, which appear as straight lines, as is the case in the examples as shown in FIG. 1 and FIG. 2.

Furthermore, the time constants for the (attack/release) gain contours may be adjusted during processing. For example, for each block, to (automatically) select the slowest necessary attack to catch a given value exceeding the limit, since slower gain change generally means less distortion. As another example, the exceeding peaks over a period of time may be averaged and then the attack/release contour may be adjusted accordingly.

FIG. 2 illustrates a further exemplary audio signal. In particular, identical or like reference numbers as shown in FIG. 2 may indicate identical or like elements in FIG. 1, such that repeated description thereof may be omitted for reasons of conciseness.

In particular, the exemplary audio signal in FIG. 2 may show higher amplitude peaks at some points, in which gain release and gain contour curves may not fully extend down to the threshold line 219 for each (or some) signaling block(s) and overlap. This may happen if the signal peaks are much higher than the clipping threshold or a located in close proximity so that the individual release and attack contours meet before fully decaying. For instance, in the example of FIG. 2 the gain release contour 205 for signal block 0-63 in diagram I-B does not fully extend to or reach the threshold line 219, and is cut-off (or truncated), e.g., at the place where the gain release contour and/or the gain attack contour curves meet (or in some cases simply at the respective boundary of the signal block).

Similar as illustrated above in the example of FIG. 1, a final gain contour 207 is determined for the current signal block 206 (samples 0-63) based on the preliminary gain (attack) contour 204 and the preliminary gain (release) contour 205, resulting in a completed signal block 206 (see diagram II-A of FIG. 2). Similar as in the example of FIG. 1, the preliminary gain attack contour 204 may be discarded after the final gain contour 207 has been determined, while the gain release contour 205 may be retained, before the process being continued to the next signal block (i.e. samples 64-127).

Then, the above process successively continues for signal block (samples 64-127) and the succeeding signal block (samples 128-191), leading to gain attack 209 and gain release 210 contour curves, as show in diagrams II-A and II-B of FIG. 2. Notably, in diagram II-B, it can be seen that in the forward pass of the current block (samples 64-127), the release contour curve 210 is determined to start from the last final gain contour value 221 of the previous signal block (i.e., sample 63 in the present example). As mentioned above, the forward pass works on the preliminary gain contour having the attack contour curves 209 as generated by the backward pass, and adds the release contour curves 210 by immediately following upwards gain movements and decaying downwards gain movements.

As such, the gain attack contour curve 209 and the gain release contour curve 210 are joined at joint points 221 and 222 that are above the clipping threshold. The gain curves of the two neighboring signal peaks influence each other and the joint points 221 and 222 are where the release contour of the previous peak meets the attack contour of the next peak. The gain from the previous peak will not completely fade down before the gain effect for the next peak starts. The result is a finished gain contour 211 for signal block (64-127). Notably, in the case that two meeting gain contours are not fading down to the clipping threshold (e.g. meaning reaching a gain of 1 or 0 dB), the gains causing a larger signal modification (i.e. a larger attenuation) are selected for the preliminary gain contour. Although in the figures, for illustrative purpose, the larger gain contours are shown to be selected, in practice the smaller gain values (gains <1) remain and from the preliminary gain contour. Again, what is shown in the figures quantitatively corresponds to attenuation.

The process then repeats in diagrams III-A, III-B, IV-A and IV-B of FIG. 2, for which the respective repeated description may be omitted for reasons of conciseness.

In particular, when determining preliminary gain release contour 217 during processing of the signal block (samples 192-255) as shown in the example of diagram IV-B, it may be noticed that, as illustrated, the amplitude peak 218 would have a gain release contour that have gain values (completely) below (or smaller than) the preliminary gain release contour of the preceding peak. In fact, in terms of gain, the gain value for peak 218 is larger than the preliminary gain release contour 217 (because the gains are <1; as mentioned above, the illustrated curves relate to attenuation). In this case, the respective gain release contour of the amplitude peak 218 may be (completely) discarded when determining the preliminary gain release contour 217 for the signal block (samples 192-255). This may be achieved by simply generating the release contour 217 in the forward pass starting from the last sample of the previous signal block (i.e., sample 191 in the present example), as illustrated above.

Summarizing, in a broad sense, the gain values for the preliminary gain contour and the final gain contour may be determined in such a manner that, during the backwards pass, if the next input signal sample (in the backwards pass) exceeds the clipping threshold and is larger than the current input signal sample, the preliminary gain value for the next sample is set so as to attenuate the next sample in accordance with the clipping threshold; and if the next input signal sample (in the backwards pass) exceeds the clipping threshold and is smaller than the current one, the preliminary gain value for the next sample is set so as to smoothly decay from the gain value of the current input signal sample. On the other hand, during the forwards pass, if the next preliminary gain value is larger than the current one, the next final gain value is set to the next preliminary gain value, otherwise the next final gain value is set so as to smoothly decay from the current final gain value. Particularly, the forwards pass of the next signal block starts with the last final gain value of the current signal block so that the final gain contour for the current signal block is a continuous function of gain values for the signal samples of the current block, having a continuous transition to the gain contour of the next signal block.

Figure 3:
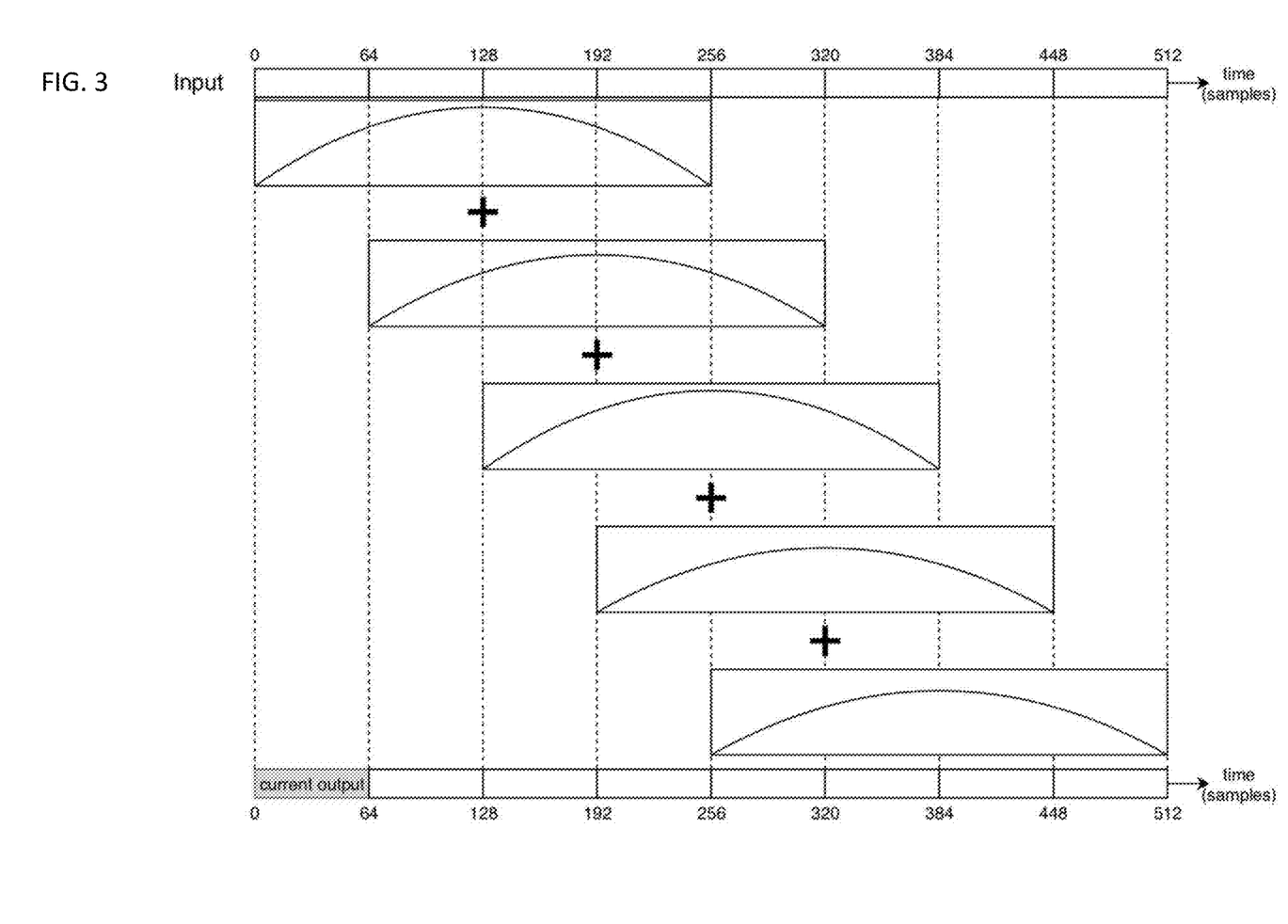
FIG. 3 illustrates how signal blocks overlap in an exemplary audio signal.

FIG. 3 schematically illustrates an example of how signal blocks overlap in an exemplary audio signal processing base on the overlap-add approach as is used in many signal transformations such as FFT or MDCT.

In particular, in the example of FIG. 3 a window size of 256 samples and a hop size (or sometimes also being referred to as a block size) of 64 samples are used, as similarly exemplified in FIGS. 1 and 2. However, it should be understood that any other suitable window and/or hop size(s) may be applied to the processing of the audio signal, according to various implementations and/or requirements.

As can be seen from the example of FIG. 3, when the samples of the input audio signal are being processed, the output signal may be, in some cases, generated in real time (or near-real time). While in some other cases, it may also be possible that the audio processing is performed in non-real time (with noticeable delay), as will be appreciated by the skilled person.

Referring back to the example of FIG. 3, samples 0-63 of the output signal may be generated (solely) based on samples 0-255 of the first 4 blocks in the first window of the input signal. Subsequently, samples 64-127 of the output signal may be generated based on samples 64-320 of blocks 2-5 in the second window. The second window comprises samples of the input signal by shifting (or moving) the first window with the hop size. Similarly, samples 128-191 of the output signal may be generated based on samples 128-384 of blocks 3-6 in the third window. This so-called 'overlap-add' method then continues, until the output signal is completely generated. It is nevertheless worthwhile to note that, even though an overlap-add method is used in the example of FIG. 3 for illustration purpose, in practice any other suitable signal processing method may be implemented when generating the output signal, as will be appreciated by the skilled person.

Figure 3A:
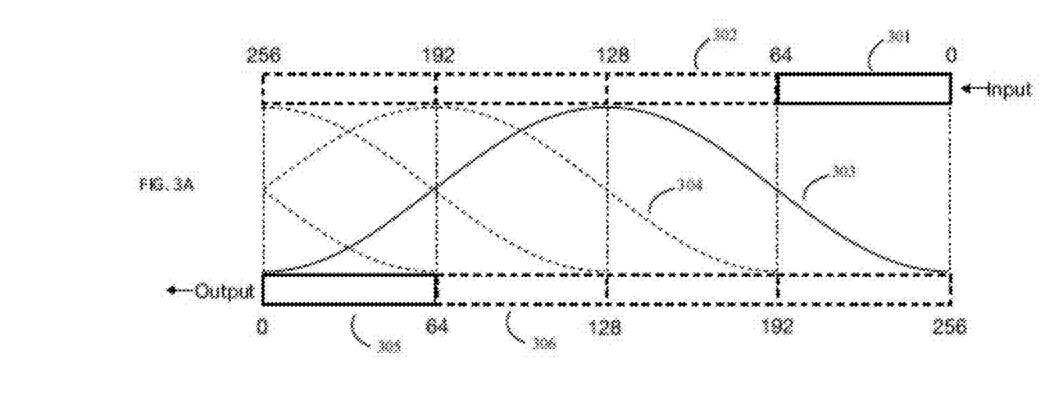
FIG. 3A illustrates the output frame of a four times oversampled overlap-add scheme.
Figure 3B:
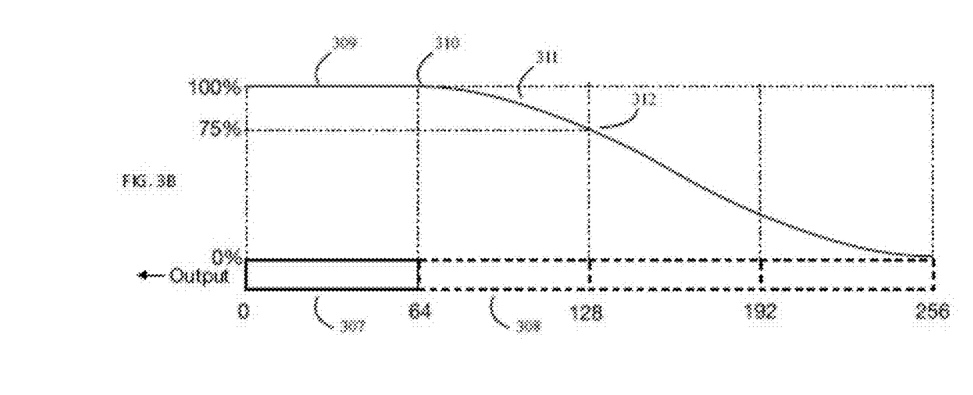
FIG. 3B illustrates the decline in certainty in reconstruction of the output frame.

FIG. 3A illustrates how the output frame of a four times oversampled overlap-add scheme is generated. FIG. 3B illustrates the continuous decline in certainty in generating the output frame when employing the four times oversampled overlap-add scheme.

Figure 4:
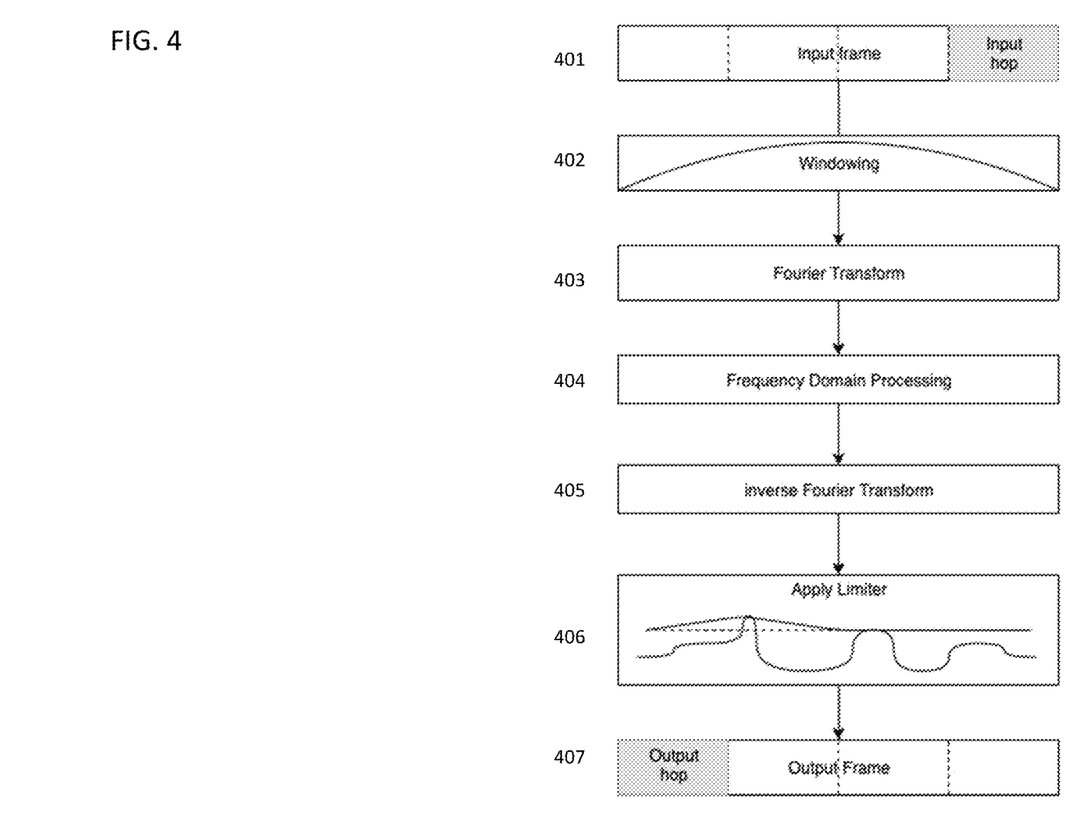
FIG. 4 illustrates a method for processing and applying a limiter function to an audio signal.

In FIG. 3A, a 256-sample input frame is constructed by attaching a new hop of 64 samples 301 to the three previous input hops, such as 302. A 256-sample window, such as a Hann window 303 may then be applied, before further frequency domain processing. After processing, the result of the current processing may be windowed again 303 and is then added to the shifted outputs of previous iterations 304, to form the current output hop 305. This current output hop 305 contains contributions of the last 4 frames, as shown by the dashed lines. The next output hop 306 is currently still missing a small contribution of the next processing iteration. Since the current output hop 307 in FIG. 3B needs to be completed, it must follow that the certainty of that hop 309 is 100%. For the following output hop 308, this certainty is declining from 100% (310) down to about 75% (312). This growing uncertainty 311 in reconstruction of the output frame is a motivation of only considering one future hop when predicting possible signal peaks. 84. FIG. 4 schematically illustrates an example of a method for processing and applying a limiter function to an audio signal.

In particular, in step 401 an input audio signal may be provided. More particularly, the audio signal may be (pre-) processed if necessary, e.g., using A/D converting, sampling, etc., as will be appreciated by the skilled person. Additionally, a hop size may also be determined that may be applied to the overlap-add procedure later. Then in step 402 a window function with a predetermined window size (e.g., 256 samples) is applied to the input signal (or frame), resulting in a windowed block of samples. Next, in step 403 a Fourier transform (e.g., FFT) is applied to transfer the sample from the original time domain to the frequency domain, such that suitable frequency domain processing can then be applied to the samples in step 404. Thereafter, the processed samples are inversely transferred back from the frequency domain to the original time domain (e.g., using IFFT) in step 405. Then, a signal limiter function as illustrated above can be applied to the time domain samples in step 406 for providing clipping protection. As mentioned above, the signal limiter function may be applied on a hop-by-hop basis with the need of only one hop look-ahead. This allows for clipping protection without adding a further signal delay. Finally, a corresponding output signal (or frame) can be generated in step 407 for playback, for example by using the overlap-add method as illustrated above. Notably, the signal processing method as shown in FIG. 4 merely serves the purpose of illustration but not as limitation. That is to say, any other suitable steps or substeps may as well be applied to the processing of the audio signal, as can be clearly understood and appreciated by the skilled person.

Figure 5:
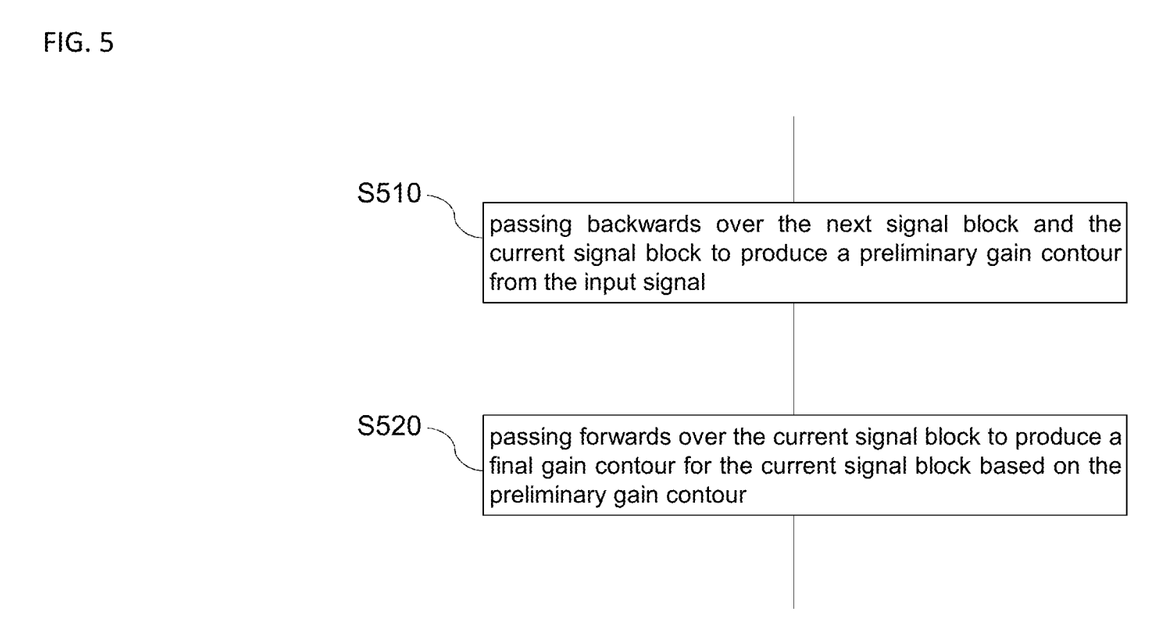
FIG. 5 illustrates an example of a flow chart of a method according to an embodiment of the present disclosure.

FIG. 5 is a flowchart schematically illustrating a method according to an embodiment of the present disclosure. The method may be used for determining dynamic gain values to be applied on a digital input signal arranged in blocks. The dynamic gain values may be used for attenuating input signal values exceeding a clipping threshold.

In particular, the method starts, in step S510, passing backwards over the next signal block and the current signal block to produce a preliminary gain contour from the input signal. Then, the method continues, in step S520, passing forwards over the current signal block to produce a final gain contour for the current signal block based on the preliminary gain contour. More particularly, the gain contours are produced by applying an instant gain ascent and a smooth gain decay to the gain contours. For example, the preliminary gain contour is produced by applying, in reverse input signal direction, an instant gain ascent and a smooth gain decay to the input signal. The final gain contour may be produced by applying forwards an instant gain ascent and a smooth gain decay to the preliminary gain contour. The determined gain contour for the current signal block may then be applied as attenuation to signal samples of the current block to prevent signal clipping (e.g. by multiplying the signal value with the corresponding time varying gain value). The process may be repeated with the next signal block. Since only one signal block look ahead is necessary, little delay is introduced. In case of signal processing based on an overlap-add approach, the disclosed signal clipping protection can be smoothly incorporated into the overall overlap-add processing steps such that no additional delay is introduced.

As illustrated above, in some cases, the backwards pass may generate, in the preliminary gain contour, gain attack curves for signal peaks in the current and the next signal block; while the forwards pass may generate, in the final gain contour, gain release curves for the signal peaks in the current signal block. Particularly, the release/attack contours may be based on a given gain curvature that is to be attached before and after the signal peaks. For example, a linear ramp function having a given slope is respectively attached to each signal peak. The required gain (or attenuation) at the signal peak is determined so as to limit the signal peak amplitude to an acceptable level, e.g. the clipping threshold or a value having an amplitude below the clipping threshold (e.g. to provide a safety margin to the clipping threshold). As mentioned above, the gain typically has a value smaller than 1 so as to attenuate the signal. Alternatively, the gain may be determined differently so as to meet a given signal limitation criteria (e.g. based on signal energy). In any case, the preliminary gain release/attack contours define gain release/attack sections having a varying gain that decreases/increases from/to an extreme gain value located at the corresponding signal peak. The skilled person understands that the extreme gain value corresponds to a minimum gain (<1) or a maximum attenuation. During the gain release/attack sections, the gain value continuously changes to avoid abrupt gain jumps which may cause audible distortions. In addition, the peak of the signal is limited to prevent clipping. In case that multiple gain release/attack contours from different signal peaks overlap, the gain value causing the largest attenuation is selected for each signal sample of the overlap region, in order to take the necessary signal reduction for the largest signal peak into account.

Notably, the method may be performed in a repeated (or recursive) manner for each block of the input audio signal, as will be appreciated by the skilled person. Particularly, it should be understood that, even though not explicitly shown in the figures, the above repeated/recursive procedures for generating the final gain contour (and also the preliminary gain contour) is explicitly disclosed for all signal blocks in the input audio signal other than the last signal block, since the above method in theory relies on the determination based on both the current signal block and the succeeding signal block. However, it is considered to be readily understandable and straightforward to the skilled person that, for the last signal block, the preliminary gain release contours, the preliminary gain attach contours and correspondingly also the gain contour may be determined simply based on the current (i.e., the last) signal block. Moreover, it is to be noted that the method may further be applied in combination with the overlap-add approach (e.g., using a predefined hop size) to the input audio signal for generating the final output signal, as exemplified in FIG. 3.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims. Moreover, claim language reciting "at least one of" a set indicates that one member of the set or multiple members of the set satisfy the claim.

It should be noted that the apparatus (device) features described above correspond to respective method features that may however not be explicitly described, for reasons of conciseness. The disclosure of the present document is considered to extend also to such method features. In particular, the present disclosure is understood to relate to methods of operating the devices described above, and/or to providing and/or arranging respective elements of these devices.

It should also be noted that the disclosed example embodiments can be implemented in many ways using hardware and/or software configurations. For example, the disclosed embodiments may be implemented using dedicated hardware and/or hardware in association with software executable thereon. The components and/or elements in the figures are examples only and do not limit the scope of use or functionality of any hardware, software in combination with hardware, firmware, embedded logic component, or a combination of two or more such components implementing particular embodiments of this disclosure.

It should further be noted that the description and drawings merely illustrate the principles of the present disclosure. Those skilled in the art will be able to implement various arrangements that, although not explicitly described or shown herein, embody the principles of the present disclosure and are included within its spirit and scope. Furthermore, all examples and embodiment outlined in the present disclosure are principally intended expressly to be only for explanatory purposes to help the reader in understanding the principles of the proposed method. Furthermore, all statements herein providing principles, aspects, and embodiments of the present disclosure, as well as specific examples thereof, are intended to encompass equivalents thereof.

The invention claimed is:

1. A method for determining dynamic gain values to be applied on a digital input signal, the digital input signal arranged in signal blocks, the dynamic gain values for attenuating input signal values exceeding a clipping threshold, the method comprising:
    passing backwards over a next signal block and a current signal block to produce a preliminary gain contour from the digital input signal, wherein the preliminary gain contour is produced by applying in reverse an instant gain ascent and a smooth gain decay to the digital input signal; and
    passing forwards over the current signal block to produce a final gain contour for the current signal block based on the preliminary gain contour, wherein the final gain contour is produced by applying forwards the instant gain ascent and the smooth gain decay to the preliminary gain contour.

2. The method of claim 1, further comprising discarding the preliminary gain contour and repeating the backwards pass and the forward pass for the next signal block.

3. The method of claim 1, wherein the backwards pass generates, in the preliminary gain contour, gain attack curves for signal peaks in the current and the next signal block.

4. The method claim 1, wherein the forwards pass generates, in the final gain contour, gain release curves for signal peaks in the current signal block.

5. The method of claim 1, wherein if a next digital input signal in the backwards pass exceeds the clipping threshold and is larger than the digital input signal, the preliminary gain value for the next digital input signal is set so as to attenuate the next digital input signal in accordance with the clipping threshold, and
wherein if the next digital input signal in the backwards pass exceeds the clipping threshold and is smaller than the digital input signal, the preliminary gain value for the next digital input signal is set so as to smoothly decay from the gain value of the digital input signal.

6. The method of claim 1, wherein, in the forwards pass, if a next preliminary gain value is larger than the preliminary gain value, a next final gain value is set to the next preliminary gain value, otherwise the next final gain value is set so as to smoothly decay from the final gain value.

7. The method of claim 6, wherein the forwards pass of the next signal block starts with a last final gain value of the current signal block so that the final gain contour for the current signal block is a continuous function of gain values for signal samples of the current signal block, having a continuous transition to the gain contour of the next signal block.

8. The method of claim 1, wherein the preliminary gain contour and the final gain contour are produced by applying a one-pole filter with infinite ascent.

9. The method of claim 1, wherein the rate of gain change is dynamically adapted based on a signal peak in a current hop or a next hop.

10. The method of claim 9, wherein the slowest gain change rate to reach a signal peak in the current hop or next hop is selected.

11. The method of claim 1, wherein the gain change rate is dynamically adapted based on an average of peaks in the digital input signal over a period of time.

12. The method of claim 1, wherein the final gain contour for the current signal block is applied as attenuation to signal samples of the current signal block to prevent signal clipping.

13. The method of claim 1, wherein the final gain contour is a smooth curve having its maxima at input signal peaks.

14. The method of claim 1, wherein the signal blocks are arranged in frames of multiple blocks and processed by an overlap-add method.

15. The method of claim 1, further comprising frequency domain processing of the input signal, a time domain signal reconstruction of the processed input signal.

16. An apparatus for determining dynamic gain values to be applied on a digital input signal, the digital input signal arranged in signal blocks, the apparatus comprising:
a backwards processor for passing backwards over a next signal block and a current signal block to produce a preliminary gain contour from the digital input signal; and
a forwards processor for passing forwards over the current signal block to produce a final gain contour for the current signal block based on the preliminary gain contour,
wherein the backwards processor and the forwards processor produce gain contours by applying an instant gain ascent and a smooth gain decay.

17. The apparatus of claim 16, further comprising:
a signal limiter for providing clipping protection; and
a signal attenuator for applying the final gain contour provided as attenuation to signal samples of the current signal block.

18. A non-transitory computer-readable medium storing instructions for determining dynamic gain values to be applied on a digital input signal, the digital input signal arranged in signal blocks, the dynamic gain values for attenuating input signal values exceeding a clipping threshold, which when the instructions are executed by at least one processor, causes the at least one processor to:
pass backwards over a next signal block and a current signal block to produce a preliminary gain contour from the digital input signal, wherein the preliminary gain contour is produced by applying in reverse an instant gain ascent and a smooth gain decay to the digital input signal; and
pass forwards over the current signal block to produce a final gain contour for the current signal block based on the preliminary gain contour, wherein the final gain contour is produced by applying forwards the instant gain ascent and the smooth gain decay to the preliminary gain contour.

* * * * *